United States Patent [19]

Norris et al.

[11] Patent Number: 5,491,774

[45] Date of Patent: Feb. 13, 1996

[54] HANDHELD RECORD AND PLAYBACK DEVICE WITH FLASH MEMORY

[75] Inventors: Elwood G. Norris, Poway; Norbert P. Daberko, Oceanside; Steven T. Brightbill, San Diego, all of Calif.

[73] Assignee: Comp General Corporation, Poway, Calif.

[21] Appl. No.: 229,731

[22] Filed: Apr. 19, 1994

[51] Int. Cl.[6] ............................. G10L 9/00; G11B 27/031
[52] U.S. Cl. ............................................ 395/2.79; 369/29
[58] Field of Search ................... 395/2.79, 2.85, 395/2.86, 2.44; 369/25, 29; 364/419.15

[56] References Cited

U.S. PATENT DOCUMENTS

| | | | |
|---|---|---|---|
| 334,933 | 4/1893 | Takahashi | D14/165 |
| 3,261,022 | 7/1966 | Glenn, Jr. | 365/52 |
| 4,228,322 | 10/1980 | Bringol et al. | 179/15.55 |
| 4,271,331 | 6/1981 | Kalkstein | 179/15 H |
| 4,338,638 | 7/1982 | Orita | 360/60 |
| 4,376,874 | 3/1983 | Karban et al. | 179/15.55 |
| 4,435,832 | 3/1984 | Asada et al. | 381/34 |
| 4,462,246 | 7/1984 | Advani et al. | 73/23 |
| 4,628,484 | 12/1986 | Hattori | 365/52 |
| 4,811,287 | 3/1989 | Kupersmith et al. | 365/52 |
| 4,864,620 | 9/1989 | Bialick | 381/34 |
| 4,908,793 | 3/1990 | Yamagata et al. | 365/52 |
| 4,945,448 | 7/1990 | Bremenour et al. | 365/52 |
| 5,008,871 | 4/1991 | Howells et al. | 369/28 |
| 5,163,111 | 11/1992 | Baji et al. | 395/22 |
| 5,175,769 | 12/1992 | Hejna et al. | 381/34 |
| 5,177,799 | 1/1993 | Naitoh et al. | 381/34 |
| 5,184,971 | 2/1993 | Williams | 365/52 |
| 5,197,052 | 3/1993 | Schroder et al. | 369/25 |
| 5,260,555 | 11/1993 | Sakamoto | 235/492 |
| 5,267,218 | 11/1993 | Elbert | 365/226 |
| 5,341,254 | 8/1994 | Ueno | 360/62 |
| 5,367,199 | 11/1994 | Lefkowitz et al. | 307/116 |
| 5,394,445 | 2/1995 | Ball et al. | 379/67 |

OTHER PUBLICATIONS

"Microsoft Press Computer Dictionary", Microsoft Press, 2nd Edition, 1994, pp. 168 and 295, Editor Casey D. Doyle.

*Primary Examiner*—Allen R. MacDonald
*Assistant Examiner*—Michelle Doerrler
*Attorney, Agent, or Firm*—Thorpe, North & Western

[57] ABSTRACT

A record/playback device for use with a removable, interchangeable, flash memory recording medium which enables extended recording comparable with tape cassette dictating equipment. The device includes a housing, a microphone element, control circuitry and a switch mounted on the housing for selecting desired functional operations. A receiving socket is coupled to memory circuitry associated with the control circuitry and is configured for electrical coupling with a flash memory module adapted for receiving and retaining recorded digital information for storage in nonvolatile forme.

22 Claims, 7 Drawing Sheets

HANDHELD RECORD AND PLAYBACK DEVICE WITH FLASH MEMORY

BACKGROUND OF THE INVENTION

1. Field of the Invention

The present invention relates to voice recording and playback devices which include a removable recording medium capable of ready transfer to another similar recording device. More particularly, the present invention pertains to a voice recording and playback device which utilizes a nonvolatile, computer memory chip for record or playback operation for time durations equivalent to cassette tape recorders.

2. Prior Art

The development of devices that are capable of electronic recording and playback using interchangeable recording media has evolved through many technologies. Such electronic reproduction of speech has generally relied on the use of a separate and removable medium, such as a cassette tape, which stores a signal capable of reproduction through some form of amplification system. Such mediums have also included vinyl records and plastic laser disks.

A common characteristic of each of these media is a dependence upon the relative movement of the medium with respect to a sensor to facilitate recovery of the stored signal for reproduction. This requirement for physical movement has necessitated substantial power requirements implemented with hardware components which take up significant space. For example, early records made of vinyl required a turn table and drive mechanism for maintaining a controlled rate of speed. Similarly, cassette recordings utilize a capstan and mechanical drive belt system for maintaining tape speed at a predetermined rate. Laser disks require comparable drive mechanisms to facilitate relative movement of the sensor with respect to the compact disc media.

In addition to mechanical movement of the media, technical difficulties in minimizing background noise associated with sensor pickup continues to test the best minds within the recording industry. For example, stylus design for records has placed primary focus on controlling physical contact of the needle on the vinyl record. Advanced filtering techniques were applied to circuits to reduce resultant noise to a minimum.

Although laser disc technology has overcome many of the physical contact problems, optical reading systems still require conversion of an optical signal to an electrical signal. This conversion process also generates artifact signals which lead to unwanted background noise.

Concurrent with progressive improvement in drive mechanisms has been an increasing consumer interest in reduced size and increased versatility of the recorder itself. As a consequence, pocket sized recorders have become commonplace, whether based on cassette tapes or more current compact disk technology. Nevertheless, the requirement for a drive mechanism continues to limit the extent of size reduction. Indeed, most of the weight and volume of a typical record and playback device comprises the mechanical drive mechanism, associated power supply and control system. Despite decades of technical development, the voice recording and playback industry (dictation devices) continues to depend on the combination of mechanical movement of a removable recorded medium in combination with a pickup sensor.

This almost universal commitment to the use of a moveable medium, such as a cassette tape, continues despite years of experience with fixed memory within computers. For example, it is well known to store virtually all forms of data in either digital or analog format within a computer. This data may even include voice information. Although this information is available for recall, it has not led to the development of a hand-held dictation device which allows convenient use of a removable medium that can be readily inserted into a simple recording device for immediate playback or simple transfer to another similar hand-held recorder.

This use of a fixed memory storage system for voice information has also branched into peripheral components of other equipment, such as telephones. Even when used as part of a telephone answering machine for providing the prerecorded message, common practice is still to apply a cassette recording system for recording incoming messages for storage and playback. Therefore, the basic system either uses a conventional cassette recorder or relies on fixed memory storage which lacks the ability for simple and convenient transfer to other similar units as part of a readily removable, interchangeable, recording medium.

Attempts have also been made to apply fixed memory storage to hand-held devices. Commercial success, however, has been frustrated by the same inadequacies that have sustained allegiance to the standard cassette recorder over the years. For example, Information Storage Devices, Inc., has developed a small, voice record/playback device having nonvolatile memory which is stored in an EEPROM in natural analog form. Unfortunately, the analog storage format has only limited memory capacity, resulting in a short operation span of less than several minutes. Furthermore, the device retains the conventional computer format with no removable and interchangeable recording media comparable to the standard cassette. Without this convenient interchangability aspect, the small device operates with the same limitations of a conventional computer system.

OBJECTS AND SUMMARY OF THE INVENTION

It is therefore an object of the present invention to provide a record/playback device utilizing a computer chip memory which offers long play operation similar to standard cassette tapes or compact disks.

It is a further object of this invention to provide such a device which has no moving parts, and in particular, no drive mechanism or means for moving a recording medium.

Yet another object of this invention is a record/playback device which utilizes nonvolatile memory stored in an integrated chip of compact size.

A still further object of this invention is to develop a record/playback device which is approximately the size of a business card with capability of recording and playing messages which are permanently stored without a need for continuous power to maintain the memory.

Yet another object of this invention is to provide an improved dictation device which has enhanced operational control, efficiency and compactness.

An additional object of this invention is to provide a record/playback device which may be inserted in a file or personal record and which carries a stream of recorded, ongoing data which can be accessed for later use such as records relating to medical data on an individual.

It is a further object of this invention to provide a record/playback device which can be readily incorporated into monitoring devices which provide data output for keeping a permanent record of such data output.

These and other objects are realized in a record/playback device for use with a removable, interchangeable, flash memory recording medium which enables extended recording of 30 minutes or more. The device includes a microphone element configured to receive and process sound into electrical signals and control circuitry coupled to the microphone element and including signal input circuitry, amplification circuitry, analog-to-digital conversion circuitry, memory circuitry, signal output circuitry and control logic circuitry for performing record and playback functional operations with respect to the electrical signals and other regulated components of the record/playback device. A receiving socket is electrically coupled to the memory circuitry and configured for electrical coupling with a flash memory module which is capable of retaining recorded digital information for storage in nonvolatile form. A speaker is coupled to the control circuitry for playback of recorded digital information and a power source is coupled to the control circuitry for supplying electrical power to the device.

Other objects and features of the present invention will be apparent to those skilled in the art, based upon the following detailed description and the accompanying drawings.

DETAILED DESCRIPTION OF THE INVENTION

The present invention departs from long standing tradition which dictates the use of a moving media such as a cassette tape or compact disk as a requirement for an acceptable dictation device. Instead, it offers the advantages of a removable element smaller in size than a cassette tape, but which has no moving parts. This removable component comprises a flash memory chip or module which has the capacity to store digital information without need for ongoing power support. The stored information is substantially permanent and is not susceptible to magnetic erasure or modification. This information can be immediately recovered by inserting the module into any compatible recorder for immediate playback. It therefore functions in a manner comparable to a conventional handheld recorder, but without the deficiencies noted above for mechanical drive systems.

Figure 1:
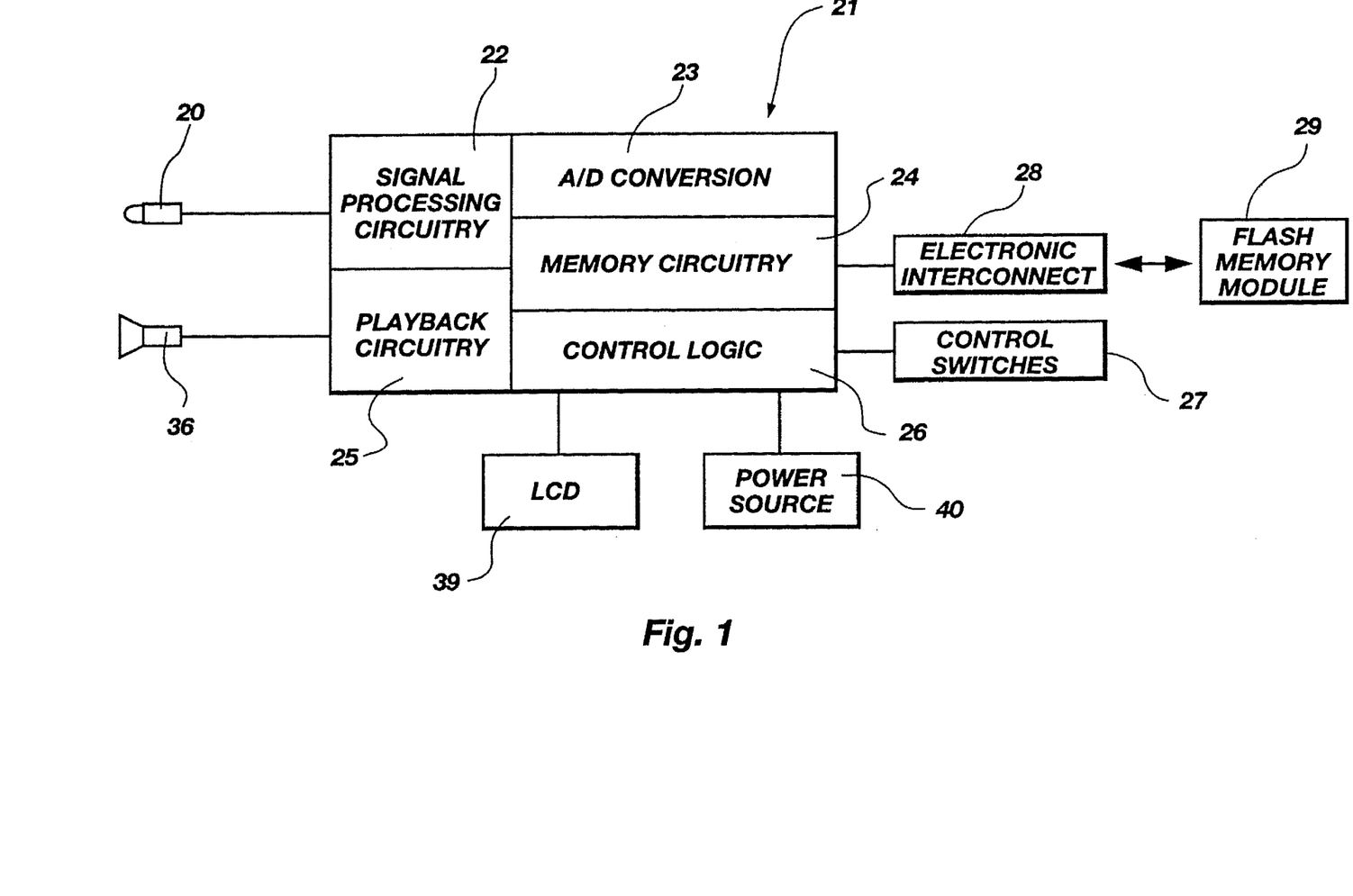
FIG. 1 is a block diagram providing a functional layout for the present invention.

The record/playback device comprises a microphone element 20 which is coupled to control circuitry 21 which processes the audio signal. Any microphone element may be used. The illustrated microphone is an electret element which is commonly used in handheld dictaphone equipment.

Figure 2:
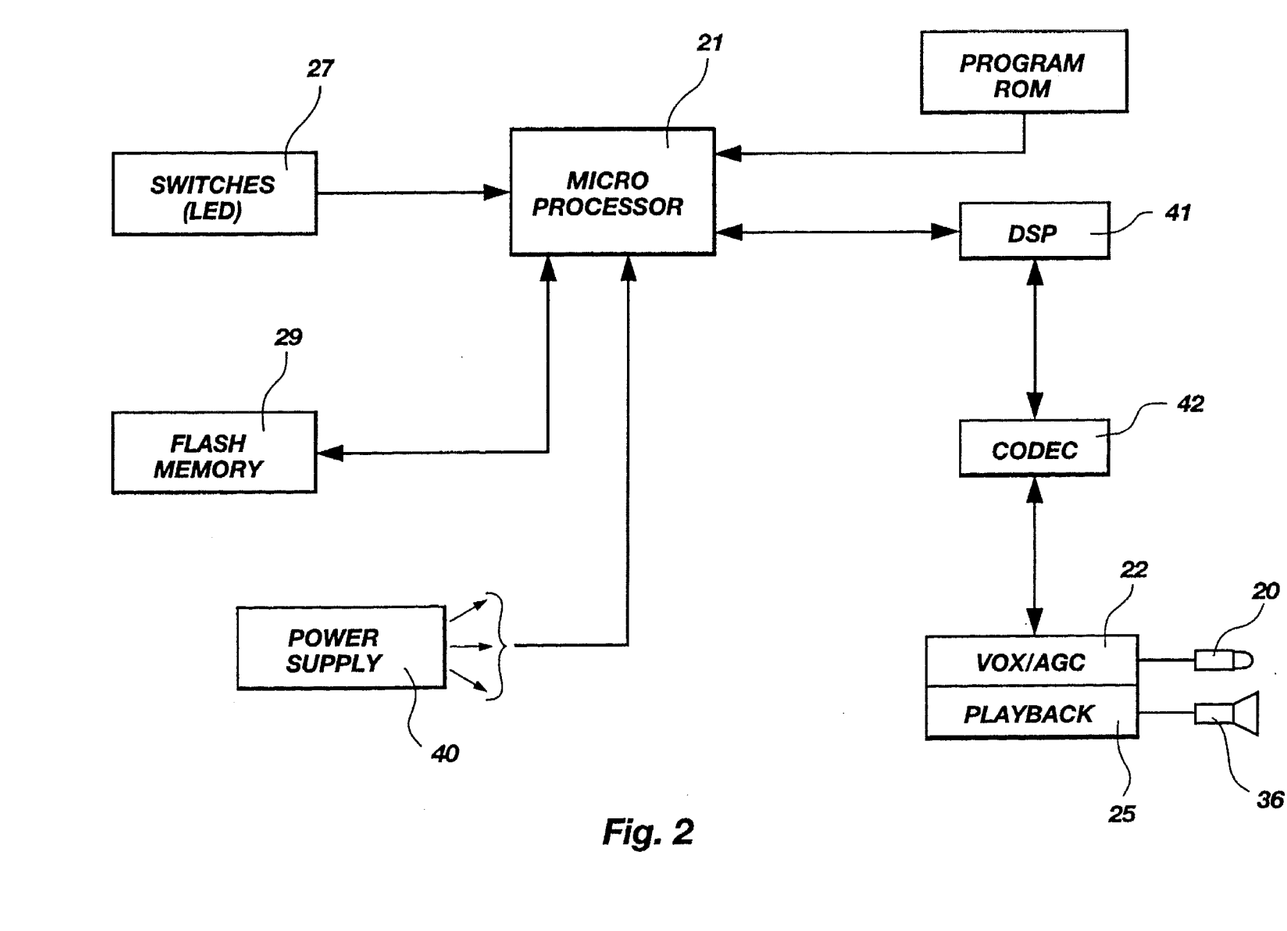
FIG. 2 is an alternate block diagram providing additional detail on the functional operations of the subject invention.

The control circuitry 21 includes signal input and amplification circuitry 22, analog-to-digital conversion circuitry 23, memory circuitry 24, signal output circuitry 25 and control logic circuitry 26 for performing record and playback functional operations with respect to the electrical signals and other regulated components of the record/playback device. Some of these functions are manually controlled by the operator with switches 27, as well as automatic operations controlled by software and firmware elements of the device. These components are discussed in greater detail hereafter.

An electronic interconnect means 28 is electrically coupled to the memory circuitry 24 and is configured for removable, electrical coupling with a flash memory module 29 capable of retaining recorded digital information for storage in nonvolatile form. The flash memory module is a digital memory storage device manufactured by Intel Corporation of Santa Clara, California (see U.S. Pat. No. 5,267,218). This module 29 includes a plurality of memories arranged in an array, which can be electrically programmable or erasable. Prior applications have been substantially limited to storage of data as part of a computer memory. Their use with a handheld dictation device has not been noted, perhaps because of the traditional expectation for need of a moving recording media.

Figure 3:
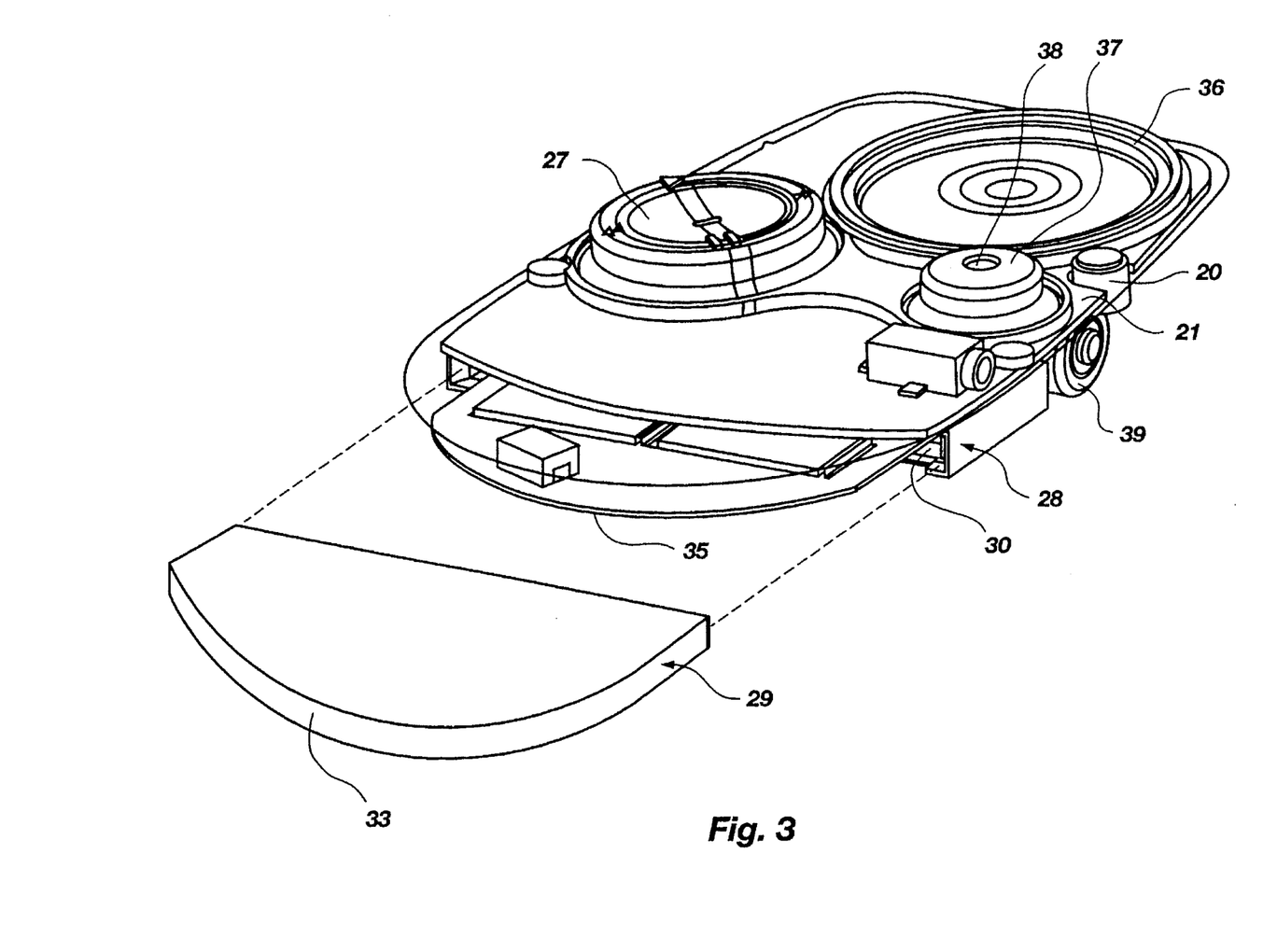
FIG. 3 is a graphic illustration of the present invention in product form.

Control of the circuitry may be by voice command where appropriate voice-to-text software is imbedded for converting the audible signal to digital command form, or it may be by manual switches as illustrated in the drawings. Specifically, a single, manually operable rocker pad 27 is centrally mounted upon a pivot support such that the rocker-pad is pivotable on respective right-angle directions responsive to manipulation of the user's thumb. This configuration enables the user to grip the recording device with one hand and easily manipulate the rocker pad to selectively execute any of a plurality of command schemes. In addition to PLAY, PAUSE, REWIND, FAST FORWARD, and SCAN commands, the rocker-pad enables INCREMENTAL FORWARD AND REARWARD MOVEMENT, DELETE, SPEED ADJUSTMENT, and other features which are essentially programmed within the control circuitry. The details of design for the rocker-pad are the subject matter of a copending patent application entitled MULTIDIRECTIONAL SWITCH ASSEMBLY FOR HAND HELD RECORDING DEVICES, filed concurrently with the present disclosure, and incorporated herein by reference.

A record control button 37 is isolated from the rocker-pad master control switch to prevent inadvertent over-write when processing through the previously described functions. This record switch 37 activates the record circuitry which requires increased voltage levels for data transfer to the flash memory module. Repeated depressing of the switch 37 operates to toggle the record circuitry between ON and OFF. A conventional LED 38 provides notice to the user when the record mode is activated.

The interconnect means 28 comprises a socket 30 configured to be PCMCIA compatible and sized to receive the flash memory module 29. When inserted within the socket 30, pins of the module 29 seat within pin receptacles of the interconnect means 28. In this sense, the small memory module is functionally similar to a cassette, in that it is inserted and removed at will. Furthermore, it can be readily inserted in other compatible machines for interchangeable use.

It will be noted from the figures that the memory module 29 is adaptable to small sizes and variable shapes because there is no requirement for moving reels or spindles to carry tapes or discs. Accordingly, size reduction benefits arise within both the recorder device which no longer requires a complex mechanical drive system, as well as the recording medium itself. The illustrated size has been adapted with contour 33 to match the shape and contour 35 of the handheld recorder. Virtually any shape may be selected, however, as long as the PCMCIA insert portion is compatible with its receiving slot 30.

A speaker 36 is coupled to the control circuitry 21, and specifically to the record playback circuitry 25, for playback of recorded digital information. Hereagain, the speaker device and attachment techniques are conventional parts of a recorder device. Selection of a specific speaker will depend on the desired quality of reproduction, as well as size limitation. For example, the speaker may consist of an ear plug jack and removable ear plug. Where the device is used for playback of music, a high fidelity speaker may be desired.

The control circuitry 21 and associated functional components are powered by a battery source 40, which is described in greater detail hereafter. Control circuitry is provided to enhance power conservation and to more effectively control allocation of voltage levels to circuitry components in accordance with specific power needs. The control circuitry includes embedded software commands for disabling certain circuitry components when not needed, as well as trigger commands to restore power for rapid response of disabled circuits. An alternate AC/DC input port is also provided.

An additional significant feature of the present device comprises compression circuitry 41 and 42 coupled to the memory circuitry 24 (generally forming part of the control circuitry generally identified as 21) for compressing digital signal for storage in the flash memory module. This circuitry includes a DSP 41 and CODEC 42 which cooperate to compress data at a ratio of 16:1 for storage. Applying such data compression provides record times of 60 minutes or more, corresponding to traditional cassette tape recording times. These same components 41 and 42 cooperate as data retrieval circuitry for expanding compressed signal to a useful output signal to be sent to the speaker 36.

Those skilled in the art will be enabled to practice the present invention based upon the preceding functional description of the inventive features, referenced to the block diagrams of FIGS. 1 and 2. The following expanded explanation is provided to facilitate an understanding of the preferred embodiment of the invention as illustrated in the drawings for a handheld device for voice dictation and retrieval. Reference to block diagram numerals will be made where possible. More specific detail as to circuitry components will be understood by those skilled in the art and may be implemented with components currently available in the market.

Overall system design is based on the use of a microprocessor which can drive all system components. This eliminates the need for use of multiple interface logic that demands a lot of board space within the circuitry. The DSP or digital support processor is coupled to the microprocessor and to a CODEC for coding and decoding the analog signal received from the microphone or transmitted to the speaker. Codec also performs the analog to digital conversion. It functions to receive the analog signal input and convert it to PCM or pulse code modulation and then feed this signal to the DSP. Conversely, when operating in play back mode, the DSP will feed pulse code modulation digital signal to the codec and the codec converts it to an analog signal that can be fed through an amplifier to a speaker.

Once the DSP compresses that data through customary hardware handshaking techniques, it feeds the data back to the microprocessor through a host bus. The basic functionality is as follows. If in a recording mode, the microprocessor sends commands to the DSP placing it into a record mode. The microprocessor places the DSP in a record mode where it retrieves data from the codec, compresses it and returns it to the microprocessor in the form of status words. The micrcontroller then takes that data and sends it out to the PCMCIA connector or through the PCMCI connector to the flash memory module.

To get the data back, the status request command is sent by the microprocessor and data is returned in compressed form. The compressed data is retrieved in 16 bit format. The specific addresses are written in the microprocessor for maintaining data location. The process involves sequential addressing through flash memory. The microprocessor's responsibility is to separate different messages and to be able to index the different messages and the different offsets within those messages. It maintains an address pointer and sequentially takes byte information from the DSP and writes it to memory in the form of a file. Conversely, the microprocessor in the play scenario places the DSP in a play mode and the DSP expects to be fed compressed data information at a specific rate. That rate is governed by hardware handshaking signals between the DSP and the microprocessor.

The microprocessor monitors data transfer status and every time the DSP is ready for another byte of information, it goes to flash, reads that byte of information from a location for spotting to a certain offset inside of a message, reads it back into the microprocessor and then writes it out to the DSP. The DSP takes blocks of 28 bytes and expands them and decompresses them into pulse code modulation. Each of those 28 bytes corresponds to 33 milliseconds of recorded analog signal.

The audio processing circuitry 22 and 25 includes circuitry that conditions the analog signal for both recording and playback. It feeds the signal through a differential amplifier. This boosts the signal and also removes common mode noise to produce a quieter signal. Following this conditioning, the signal is processed through an automatic gain control circuit (AGC) where the recording level is automatically adjusted to a favorable level.

Also attached to the recording circuit is a VOX circuit for implementing voice operated recording. This circuit determines the threshold for automatically activating the recording mechanism. This feature is typically available on dictating equipment for facilitating hands-free use.

The speaker circuit 25 includes a buzzer input, which consists of a single line from the microprocessor which allows the microprocessor to pulse out a digital signal that serves as a beep or warning sound to the user. For instance, if recording medium storage capacity is approaching full, the microprocessor initiates a warning signal which generates an LED flash and/or an audible beep.

There is also logic within the microprocessor such that if an earphone is plugged into an earphone jack, the microprocessor senses that there is an earphone in place and shuts down the speaker. This component of the playback circuit 25 is unique from conventional recorder circuitry in that the speaker is not disconnected by a physical switch upon entry of the earphone jack. In the present invention, the circuitry includes a combination AC adapter/earphone jack, which eliminates the need for a separate power input plug. This is significant not only because the earphone and AC/DC plug elements are the same size and therefore interchangeable, but this common jack input further reduces the physical size of the recorder.

Figure 4:
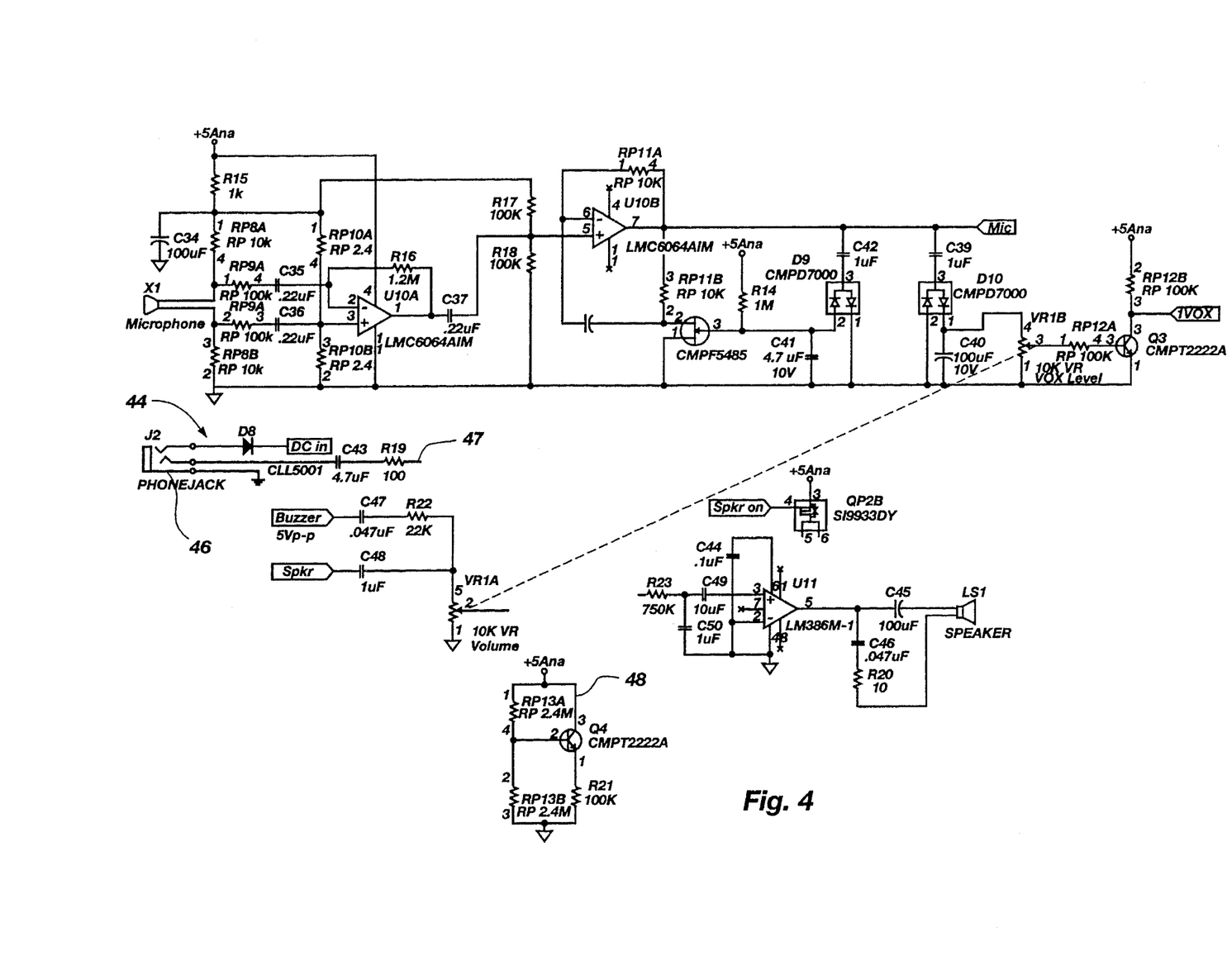
FIG. 4 is a schematic diagram illustrating component circuitry of the present invention.
Figure 5:
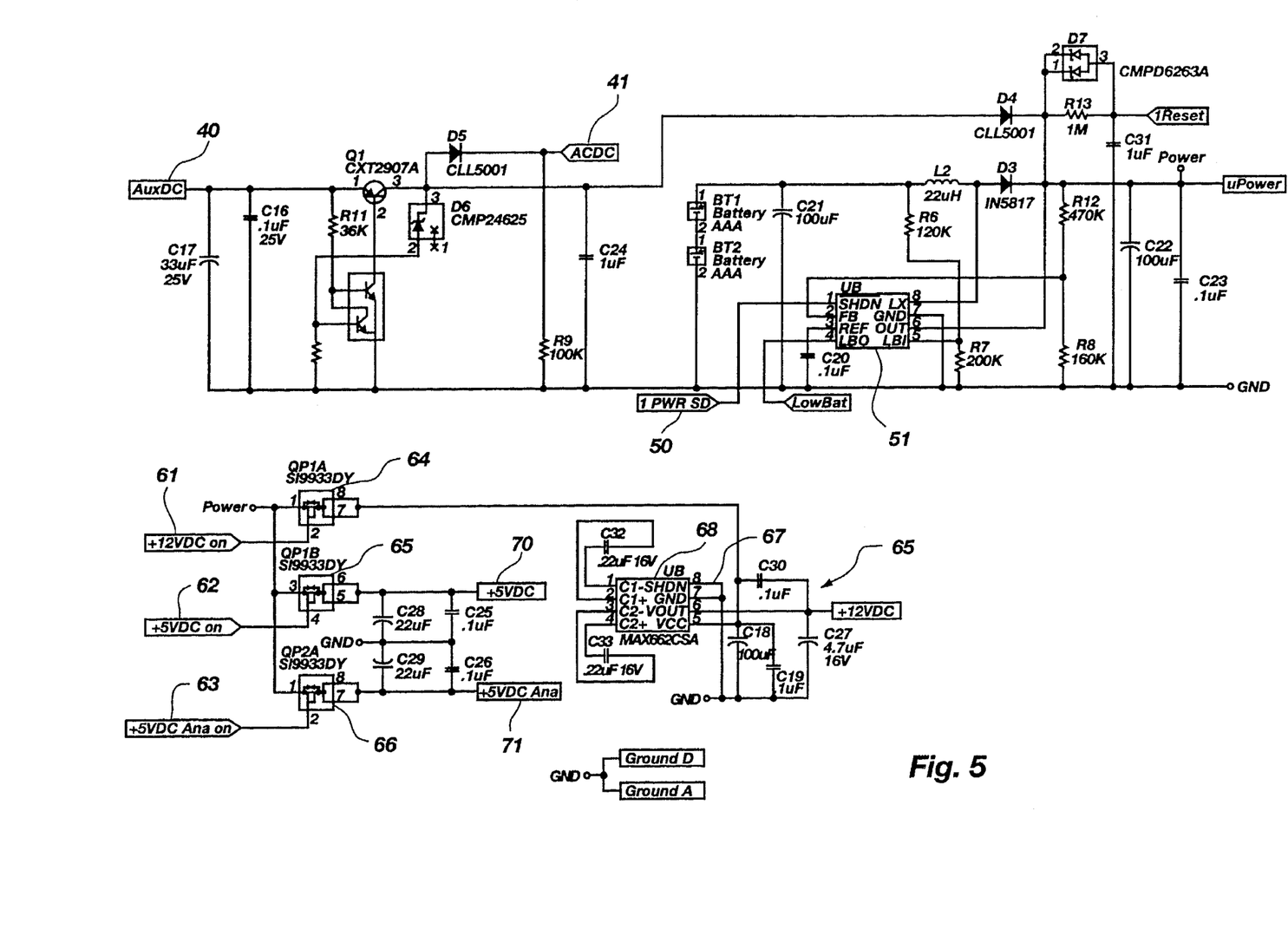
FIG. 5 is an additional schematic diagram showing other circuitry associated with the present invention.

The preferred circuitry for this combined AC/DC power input and earphone is illustrated in the signal processing circuit diagram of FIG. 4. This circuit will be explained in combination with FIG. 5, representing the power input circuitry and power conservation design. This earphone/power input circuit is designed to sense the power input signal. If a jack has been placed into the circuit, the speaker is disconnected based on whether or not a voltage is present.

Referring to the upper left hand corner of FIG. 5, a voltage signal from the ear phone DC power adapter jack is fed to a DC power input 40 of the circuit. This circuit regulates the voltage to a useful level for the main power supply circuit. This circuit also generates a signal at contact 41, referred to as AC/DC. The AC/DC signal is sent to the microprocessor. If that signal is true, the microprocessor knows that a power adaptor has been plugged in and does not attenuate the speaker. Therefore, the speaker stays on if a DC power source is added. The earphone does not establish a voltage, and therefore the voltage signal stays low and turns off the speaker based on that reduced signal.

Referring to the circuit diagram of FIG. 4, the combined earphone jack and power input are shown generally at 44. The DC-In contact 45 couples with the DC Power input 40 explained above. A standard 1/8 inch stereo phone jack 46 is used to service both earphone and power plugs. A second circuit connection 47 is supplied with a small voltage signal from a transistor amplifier 48 so that when the is speaker disabled by plugging in a earphone, only this small voltage transistor amplifier is driving it. This occurs because a signal is sent to the microprocessor which shuts down the power amplifier. Accordingly, operation of the speaker is electronically controlled by the microprocessor, rather than relying on a mechanical switch as with the prior art.

Diode D8 coupled in series with the jack 44 not only blocks any direct current, but also limits voltage to DC. Accordingly, the plug 44 will accept both AC and DC. An AC power source will simply be changed to pulsating DC, and will then be fed to the regulator circuit through 47 to be discussed hereafter. This regulator circuit operates to bypass the batteries as part of a power conservation system.

In the illustrated embodiment, two triple A batteries 39 initially power up the microprocessor with three volts. The unit is driven at three volts to conserve power. During normal operation, the voltage of the microprocessor and the rest of the circuitry is raised and lowered according to need as dictated by the microprocessor. There is an input signal 50 which is driven by the microprocessor. If a power shut down signal is received, the DC to DC converter 51 is disabled. A primary function of the DC to DC converter is to raise the three volt battery voltage up to five volts, which is the nominal operating voltage for the rest of the circuitry. Although the microprocessor does not require this higher voltage, other functional parts of the circuit, such as the flash memory write program, do operate at higher levels.

The typical microprocessor for this type of recorder operates in a very large voltage range from as low as 1.8 volts. This enables operation when batteries are low. The microprocessor also happens to be the lowest power consuming element of the device. It can be put into several modes of operation, such as a slow speed operating mode where it runs at a very low clock speed and it can run down to 0.8 volts. Alkaline cells 39 generally will operate at low range down to about 0.8 to 0.9 volts before dropping off rapidly. Therefore, two batteries in series provides reliable power down to about 1.8 volts, after which the batteries will drop off quickly and fail.

This pattern of degeneration coincides with the minimal operating voltage for the microprocessor which is 1.8 volts, making the microprocessor available to manage the various functions of the device until total battery failure. Therefore, the microprocessor can detect when it needs to use different software to operate the system and disable other systems to preserve power. In addition, the microprocessor also sends a signal back 50 for power shut down to reduce its own power voltage level from 5 volts down to the current battery voltage of 3 volts when fully charged, and as low as 1.8 volts as the batteries age.

This operating range enables the microprocessor to shut down the DC to DC convertor, which also consumes power and is more inefficient. For example, a typical DC to DC converter will operate at 85 percent efficiency, leaving a fifteen percent power loss. By disabling this circuit, this excess power drain is avoided. During periods of nonuse, the microprocessor software algorithm determines that full power supply is not needed, and goes into a complete shutdown. The microprocessor then converts the keyboard input to a wake up function, with all other systems at a halt stage.

A "halt stage" occurs when the circuitry is no longer executing functional commands and the clock is no longer running. It is now running in its minimal operating mode which will be drawing from 1 to 2 microamps of current with nominal battery drain. In that low power mode the battery life is just as good as shelf life. In fact, it would take years to deplete normal batteries. The halt mode is tantamount to a full power off disconnection.

When a key or switch 27 on the unit is activated, the microprocessor wakes up, sensing a signal that generates an interrupt which starts the clock. The microprocessor starts running and executing command code. It can then interrogate what key was pressed and determine what action it needs to take, such as play or record. Normally, those functions will involve applying added power to other support circuits.

FIG. 5 illustrates the circuitry for supplying variable voltage. Three power out lines 61, 62, and 63 are driven by the microprocessor. Signals from these power sources go to electrical switches such as MOSFET devices 64, 65, 66 that distribute power to different parts of the circuitry. Generally, this occurs after the DC to DC converter has been switched on and is producing 5 volts for general operation.

In addition to producing the power up 5 volts, the DC to DC convertor also serves as the 5 volt source for everything else including the flash and the analog circuity. Once the microprocessor has brought up the DC to DC convertor, it will then apply power as needed for signals 61, 62 and 63. In other words if a 12 volt signal is needed for writing to flash memory, it will send a true signal to item number 61. A true signal there will turn on the MOSFET 64 which will apply power to a small additional DC to DC convertor 65. This additional DC to DC convertor 65 takes the 5 volt input and uses a charge pump 66 to generate 12 volts. With that 12 volts supplied, the system can now write to flash memory.

Although the concept of using the DC to DC convertor to produce 12 volts is commonly used, shutting the power off as was previously described is unique. In conventional systems, the microprocessor has a shutdown signal and many circuits will be required to implement control of that shutdown line (such as item 67). The present design strategy avoids doing that because even though that shutdown signal number 67 will in effect turn the 12 volts on and off to the flash memory, to prevent accidental erasing, the charge pump 68 still operating and is inherently inefficient. This conventional approach allows excess power loss, accelerating battery failure.

In fact, it is part due to this new design feature that flash memory has be made adaptable for small, handheld recorders. For example, flash memory is commonly used on computer circuit boards where batteries are not the primary source of power. In this case, AC power is plentiful and power consumption is not an issue. Instead, power shutdown in conventional computer applications of flash memory is more of a safety precaution to prevent accidental erasing flash memory, rather than for conserving power.

With the 5 volts generated by the DC to DC converter, DC power is fed through three MOSFET devices. There are two branches 70 and 71 within that circuit. Line 52 assists in controlling the 5 volt power 70 which goes to flash memory as well as the DSP. The DSP of all the devices on the board currently are the most power hungry devices and like the charge pump, the 12 volt convertor can be shut down but even in a shut down state still draws a tremendous amount of power on the order of 5 milliamps. This is unacceptable in a shutdown state for a battery operated, hand held recorder.

With respect to line 63 of FIG. 5, there is provided a 5 volt analog enable signal for noise reduction. It is important to keep the analog power supply separate of the digital power supply. This line feeds the amplifier circuits 71 and is a unique 5 volt power line separated from the other line for noise reasons. Digital circuits generate a fair amount of noise on the power lines. Without a separate line from the digital side, occasionally noise sounds through the speaker even though the DSP is turned off. For instance, in the event of a timing function or a low battery indication or VOX mode, if the unit is currently off because there is insufficient sound level the DSP will be powered down to conserve energy. In a quiet period it is unnecessary to drive all the digital circuitry. But the analog circuitry may be kept up for generating a warning sign, a beep or something that warns that batteries are getting low.

Figure 6A:
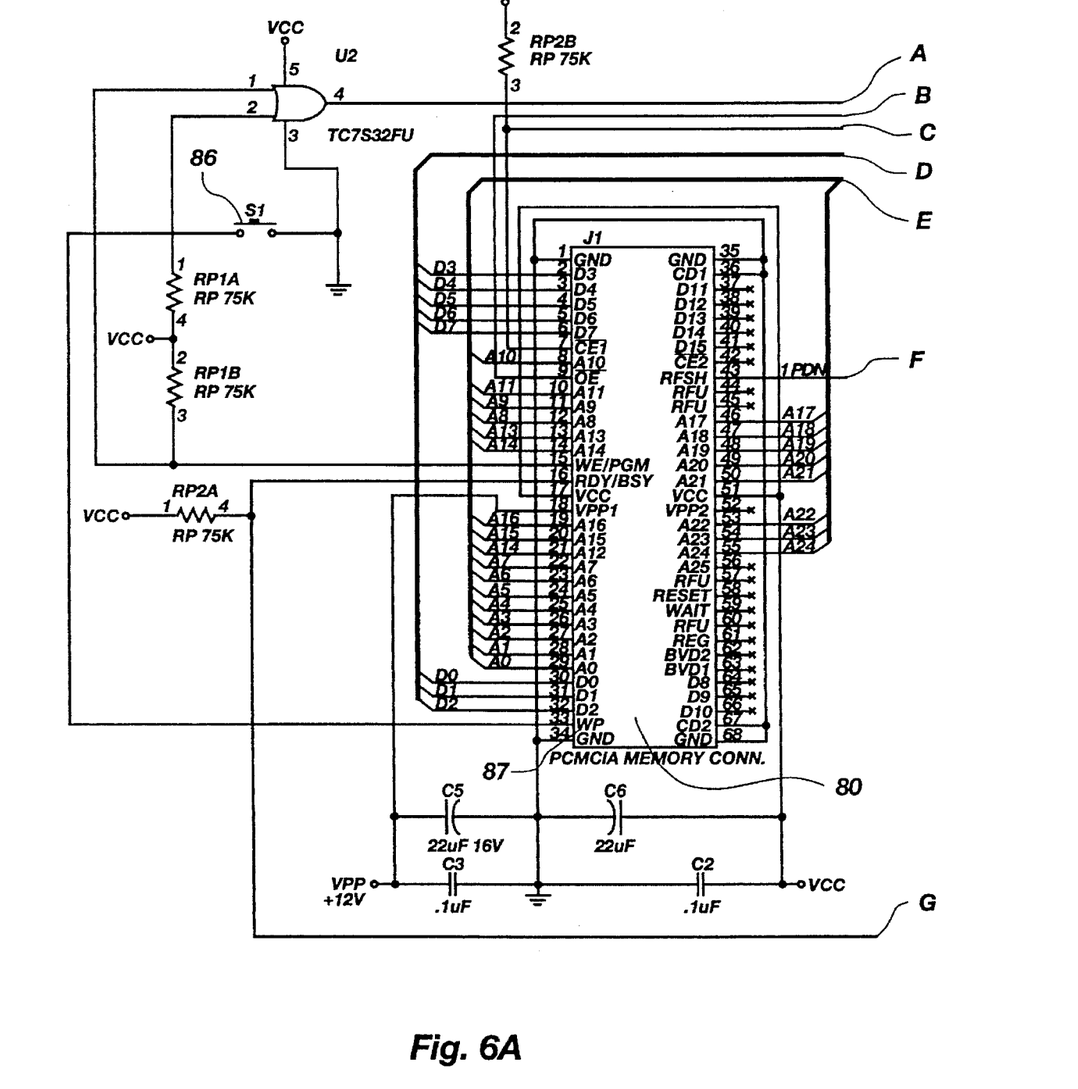
FIGS. 6A and 6B comprises a split circuit diagram for a flash memory module for use with the present invention, the combined figures representing a single circuit diagram.
Figure 6B:
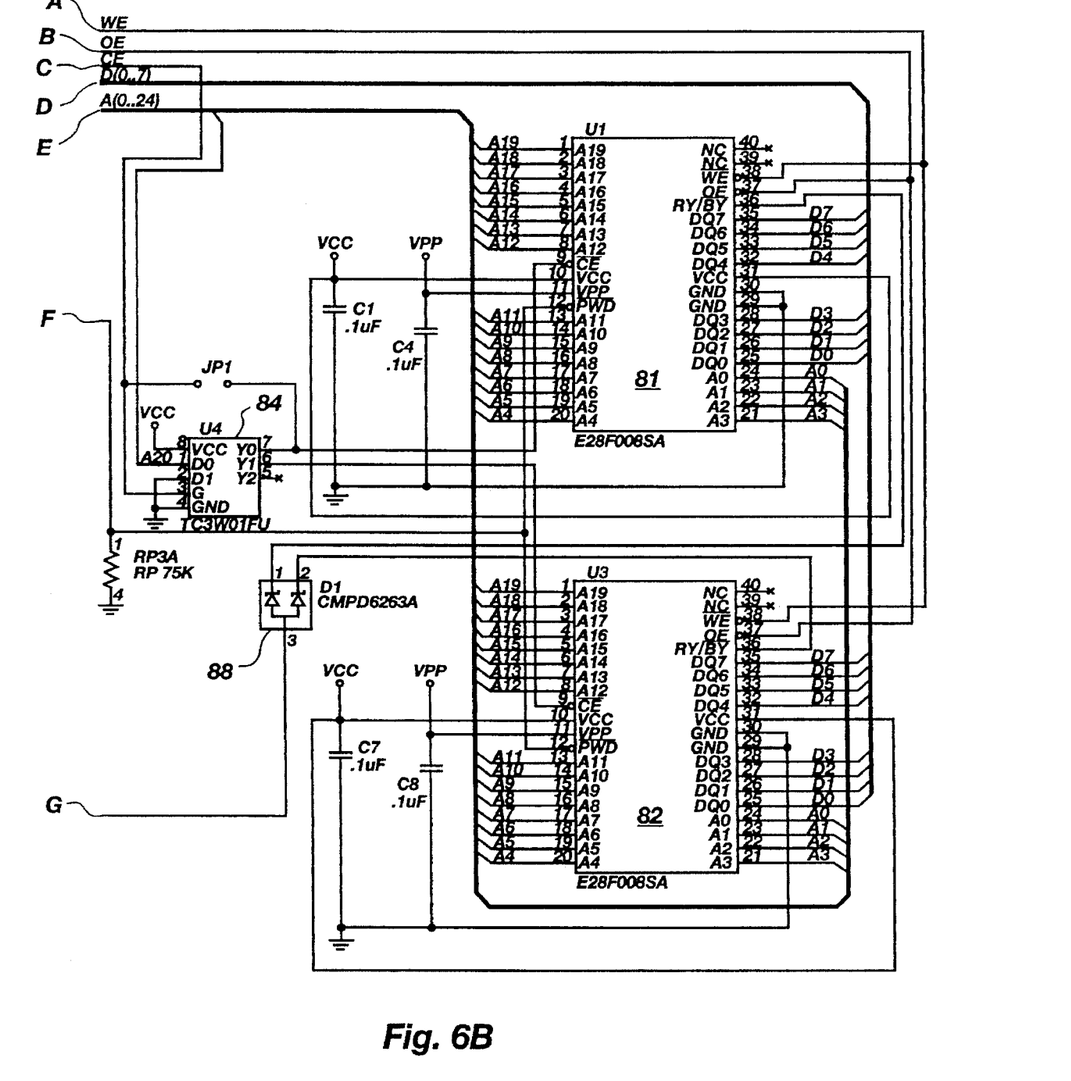

Turning now to a more detailed discussion of the flash memory module 29, FIG. 6 provides a schematic diagram of the circuit board and components. A 68 pin PCMCIA connector 80 forms the interconnect between a pair of flash memory chips 81 and 82 and hand held recorder shown in FIG. 3. All signals from the flash memory 81 and 82 pass through the connector 80. The remaining circuitry controls how this removable module communicates with the main hand held unit, and also provides a write protect function which is carried on the removable module, in contrast to conventional practice of having write protect circuitry housed within the mother unit.

The respective flash memory chips 81 and 82 form the storage base for all recorded information. This memory is permanent, nonvolatile (requiring no power support for maintenance) and not subject to inadvertent alternation by magnetic fields. The two flash chips each have 8 megabits of storage capacity, given the stated compressure ratio. This yields approximately 40 minutes of recording time, which is competitive with current cassette tape systems. This circuitry is designed to accept larger capacity flash memory chips, as they become more economically feasible The board has been designed such that one or two flash memory devices may be used. If two devices 81 and 82 are applied, the circuit is as shown, including a decoder chip 84. If one device 82 is used, the second flash chip 81 is deleted, along with the decoder chip 84. Instead, a jumper across item 85 is applied, allowing the board to be set up for a single flash memory chip configuration.

Of significant importance is the write protection circuitry provided. A switch 86 prevents erasure or deletion of data on flash memory when placed in a write protect position. For safety reasons, if the switch is closed the circuit is not write protected. If it is open, the circuit is write protected and you can not modify flash memory. Under this strategy of design, the flash memory is protected even if the switch oxidizes or becomes dirty because the switch will be open. In other words, the absolute protection comes from the open condition of the switch, wherein the write signal is interrupted, rather than being subject to the control of a special switch that must be closed for a write protect condition.

For example, in a standard cassette or compact disk device, an optical break or mechanical switch is provided on the mother unit. This switch is activated based on the position of a write protect element on the disk or compact disk. Hence, the mother unit controls the write protect function. The recording circuitry of the mother unit is turned on or off by the interrupt position on the cassette or disk. Therefore, if there is a defect in the mother circuit, the closed position of the write protect tab of the cassette may be ineffective, causing the loss of valuable data.

On the other hand, the present system has the write protect circuitry on the flash memory module. Therefore, the attempt of the mother unit to write to the disk will be blocked, because the absolute control of write protect is finally determined by the write protect circuitry of the memory module itself. In addition, a status signal is sent back to the PCMCI connector 87 advising that the device is write protected so that an appropriate error message can be generated if recording is attempted. With respect to the remaining circuitry, the illustrated capacitors are used for noise filtering. The power signals include VCC as 5 volt power, and VPP as 12 volt programming voltage. Both of power circuits have bypass caps to suppress operating noise. The pair of diodes 88 to assist in the handshaking involved between the microprocessor of the mother unit and the removable module, to coordinate the alternating write and hold patterns of the transmitting circuitry which writes segments of data to memory.

It will be apparent to those skilled in the art that numerous modifications to circuitry and design could be made the to embodiment disclosed herein. It is to be understood that such modifications are intended to be comprehended within the present invention, as defined by the following claims.

We claim:

1. A record/playback device for use with a removable, interchangeable, flash memory recording medium which enables extended recording comparable with tape cassette dictating equipment, said device comprising:

a housing;

a microphone element coupled to the housing and configured to receive and process sound into electrical signals;

control circuitry coupled to the microphone element and including signal input circuitry, amplification circuitry, analog-to-digital conversion circuitry, memory control circuitry, signal output circuitry and control logic circuitry for performing record and playback functional operations with respect to the electrical signals and other regulated components of the record/playback device;

said switch means coupled to the control circuitry for selecting the desired functional operations to be performed;

a receiving socket electrically coupled to the memory control circuitry and configured for electrical coupling with a flash memory module which operates as sole memory of the received processed sound electrical signals and is capable of retaining recorded digital information for storage in nonvolatile form;

a speaker coupled to the control circuitry for playback of recorded digital information; and a power source coupled to the control circuitry for supplying electrical power to the device.

2. A device as defined in claim 1, comprises a flash memory module inserted within the receiving socket and which has the capacity to store digital information without need for ongoing power support.

3. A device as defined in claim 2, wherein the flash memory module includes write protect circuitry operable independent of the record/playback device.

4. A device as defined in claim 3, wherein the write protect circuitry includes power down circuitry which reduces the voltage of signal being sent to the flash memory module to a level below a required threshold voltage level required to modify memory within the flash memory module.

5. A device as defined in claim 4, wherein the threshold voltage level for the flash memory module is approximately 12 volts, said control circuitry including a DC to DC converter for increasing voltage supplied by the battery source to the 12 volts, said power down circuitry of the write protect circuitry comprising means for disabling the DC to DC converter which supplies the required 12 volts.

6. A device as defined in claim 1, wherein the device comprises a hand held, dictation recording device, configured operation with one-hand control means for performing operational functions including play, record, stop, and rewind.

7. A device as defined in claim 1, wherein the switch means comprises a manually operable rocker pad mounted upon the housing such that the rocker pad is pivotable on respective right-angle directions responsive to manipulation of the user's thumb.

8. A device as defined in claim 7, further comprising a record control button isolated from the rocker pad to prevent inadvertent over-write when performing other operational functions.

9. A device as defined in claim 1, wherein the receiving socket of the device is configured to be Personal Computer Memory Card International Association (PCMCIA) compatible and sized to receive the flash memory module.

10. A device as defined in claim 1, said device further comprising compression circuitry coupled to the memory circuitry for compressing digital signal for storage in the flash memory module.

11. A device as defined in claim 10, wherein the control circuitry includes a Digital Support Processor (DSP) and Coder/Decoder (CODEC) which cooperate to compress data at a ratio of at least 16:1 for storage.

12. A device as defined in claim 1, which further includes a single input jack for alternately receiving both an external Alternating Current/Direct Current (AC/DC) power plug and an earphone plug, thereby eliminating need for separate input plugs.

13. A device as defined in claim 12, wherein the single input jack includes power sensing circuitry to sense a presence of a power input signal applied to the jack and to electrically switch off the speaker and associated circuitry.

14. A device as defined in claim 13, wherein the power sensing circuitry includes (i) means for generating a voltage signal at the single input jack, (ii) means to transmit the voltage signal to a Direct Current (DC) power input of the control circuit and (iii) means within the control circuit for maintaining an electrical connection with the speaker when the voltage signal is present.

15. A device as defined in claim 1, wherein the control circuit includes a microprocessor having logic instructions for detecting and disabling circuits within the device which can be disabled while not in use, while maintaining other systems in operable status for battery power conservation.

16. A device as defined in claim 15, wherein the microprocessor also includes circuitry shut down means for reducing power requirements of the circuitry on the battery power source down to a minimum circuitry operating level equal to the minimum operational power level of the microprocessor.

17. A device as defined in claim 16, wherein the microprocessor also includes circuitry shut down means for reducing power requirements of the circuitry on the battery power source down to a minimum voltage level sufficient only to trigger the microprocessor to awaken the microprocessor to at least a minimum operating level.

18. A device as defined in claim 1, wherein said housing is of sufficiently small dimensions so as to rest within a hand to enable fingers of the hand to simultaneously grip the housing while manipulating a switch means mounted thereon.

19. A record/playback device for use with a removable, interchangeable, flash memory recording medium which enables extended recording comparable with tape cassette dictating equipment, said device comprising:

a housing;

a microphone element coupled to the housing and configured to receive and process sound into electrical signals;

control circuitry coupled to the microphone element and including signal input circuitry, amplification circuitry, memory control circuitry, signal output circuitry and control logic circuitry for performing record and playback functional operations with respect to the electrical signals and other regulated components of the record/playback device;

said switch means coupled to the control circuitry for selecting the desired functional operations to be performed;

a receiving socket electrically coupled to the memory control circuitry and configured for electrical coupling with a recording medium which is capable of retaining recorded digital information for storage;

a flash memory module which operates as sole memory of the received processed sound electrical signals and is capable of retaining recorded digital information for storage in nonvolatile form;

a speaker coupled to the control circuitry for playback of recorded digital information; and a power source coupled to the control circuitry for supplying electrical power to the device.

20. A device as defined in claim 19, wherein the single input jack includes power sensing circuitry to sense a presence of a power input signal applied to the jack and to electrically switch off the speaker and associated circuitry.

21. A device as defined in claim 19, wherein said power source includes a single input jack for alternately receiving both an external AC/DC power plug and an earphone plug, said single input jack being coupled to the signal output circuitry to provide audio signal to the earphone plug when inserted within the single input jack.

22. A device as defined in claim 21, wherein the power sensing circuitry includes (i) means for generating a voltage signal at the single input jack, (ii) means to transmit the voltage signal to a DC power input of the control circuit and (iii) means within the control circuit for maintaining an electrical connection with the speaker when the voltage signal is present.

* * * * *

UNITED STATES PATENT AND TRADEMARK OFFICE
CERTIFICATE OF CORRECTION

| | | |
|---|---|---|
| PATENT NO. | : 5,491,774 | Page 1 of 1 |
| APPLICATION NO. | : 08/229731 | |
| DATED | : February 13, 1996 | |
| INVENTOR(S) | : Norris et al. | |

It is certified that error appears in the above-identified patent and that said Letters Patent is hereby corrected as shown below:

Column 11, line 4 in Claim 1, please delete the word "said"

Column 12, line 46 in Claim 19, please delete the word "said"

Signed and Sealed this

Twelfth Day of June, 2007

JON W. DUDAS
*Director of the United States Patent and Trademark Office*

(12) EX PARTE REEXAMINATION CERTIFICATE (9179th)
United States Patent
Norris et al.

(10) Number: US 5,491,774 C1
(45) Certificate Issued: Aug. 14, 2012

(54) HANDHELD RECORD AND PLAYBACK DEVICE WITH FLASH MEMORY

(75) Inventors: Elwood G. Norris, Poway, CA (US); Norbert P. Daberko, Oceanside, CA (US); Steven T. Brightbill, San Diego, CA (US)

(73) Assignee: e.Digital Corporation, San Diego, CA (US)

Reexamination Request:
No. 90/011,302, Oct. 27, 2010

Reexamination Certificate for:
Patent No.: 5,491,774
Issued: Feb. 13, 1996
Appl. No.: 08/229,731
Filed: Apr. 19, 1994

Certificate of Correction issued Jun. 12, 2007.

(51) Int. Cl.
*G10L 11/00* (2006.01)

(52) U.S. Cl. ..................... 704/270; 369/24.01

(58) Field of Classification Search .................. 704/270
See application file for complete search history.

(56) References Cited

To view the complete listing of prior art documents cited during the proceeding for Reexamination Control Number 90/011,302, please refer to the USPTO's public Patent Application Information Retrieval (PAIR) system under the Display References tab.

*Primary Examiner* — Henry N Tran (57) ABSTRACT

A record/playback device for use with a removable, interchangeable, flash memory recording medium which enables extended recording comparable with tape cassette dictating equipment. The device includes a housing, a microphone element, control circuitry and a switch mounted on the housing for selecting desired functional operations. A receiving socket is coupled to memory circuitry associated with the control circuitry and is configured for electrical coupling with a flash memory module adapted for receiving and retaining recorded digital information for storage in nonvolatile forme.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 19 are cancelled.

Claims 2 and 18 are determined to be patentable as amended.

Claims 3, 4 and 5, dependent on an amended claim, are determined to be patentable.

New claims 23-34 are added and determined to be patentable.

Claims 6-17 and 20-22 were not reexamined.

2. A device as defined in claim [1] *33*, comprises a flash memory module inserted within the receiving socket and which has the capacity to store digital information without need for ongoing power support.

18. A device as defined in claim [1] *33*, wherein said housing is of sufficiently small dimensions so as to rest within a hand to enable fingers of the hand to simultaneously grip the housing while manipulating a switch means mounted thereon.

*23. A device as defined in claim 33 wherein the multiple transistors are further configured to optionally disable supply of electrical power to both the microphone element and the speaker between occurrences of record and playback functional operations and in response to control signals provided by the microprocessor.*

*24. A device as defined in claim 33 wherein the multiple transistors include, at least one transistor configured to enable and to disable supply of electrical power to the receiving socket; and at least one transistor configured to enable and to disable supply of electrical power to one or both of the microphone element and the speaker.*

*25. A device as defined in claim 33 wherein the multiple transistors are configured to optionally disable supply of electrical power to the speaker in response to control signals provided by the microprocessor.*

*26. A device as defined in claim 33, wherein the microphone element is coupled to a portion of the amplification circuitry;*
  *wherein the speaker is coupled to a different portion of the amplification circuitry; and*
  *wherein enabling and disabling supply of electrical power to the microphone element includes enabling and disabling supply of electrical power to the portion of the amplification circuitry coupled to the microphone element; and*
  *wherein enabling and disabling supply of electrical power to the speaker includes enabling and disabling supply of electrical power to the portion of the amplification circuitry coupled to the speaker.*

*27. A device as defined in claim 33 further including:*
  *a DSP;*
  *wherein the multiple transistors are further configured to enable supply of electrical power to the DSP, during record and playback functional operations and in response to control signals provided by the microprocessor, and to disable supply of electrical power to the DSP between occurences of record and playback functional operations and in response to control signals provided by the microprocessor.*

*28. A device as defined in claim 34 wherein the multiple transistors are further configured to optionally disable supply of electrical power to both the microphone element and the speaker between occurrences of record and playback functional operations and in response to control signals provided by the microprocessor.*

*29. A device as defined in claim 34 wherein the multiple transistors include, at least one transistor configured to enable and to disable supply of electrical power to the flash memory module; and*
  *at least one transistor configured to enable and to disable supply of electrical power to one or both of the microphone element and the speaker.*

*30. A device as defined in claim 34 wherein the multiple transistors are configured to optionally disable supply of electrical power to the speaker in response to control signals provided by the microprocessor.*

*31. A device as defined in claim 34, wherein the microphone element is coupled to a portion of the amplification circuitry;*
  *wherein the speaker is coupled to a different portion of the amplification circuitry; and*
  *wherein enabling and disabling supply of electrical power to the microphone element includes enabling and disabling supply of electrical power to the portion of the amplification circuitry coupled to the microphone element; and*
  *wherein enabling and disabling supply of electrical power to the speaker includes enabling and disabling supply of electrical power to the portion of the amplification circuitry coupled to the speaker.*

*32. A device as defined in claim 34 further including:*
  *a DSP;*
  *wherein the multiple transistors are further configured to enable supply of electrical power to the DSP during record and playback functional operations and in response to control signals provided by the microprocessor, and*
  *to disable supply of electrical power to the DSP between occurences of record and playback functional operations and in response to contol signals provided by the microprocessor.*

*33. A record/playback device for use with a removable, interchangeable, flash memory recording medium which enables extended recording comparable with tape cassette dictating equipment, said device comprising:*
  *a housing;*
  *a microphone element coupled to the housing and configured to receive and process sound into electrical signals;*
  *control circuitry coupled to the microphone element and including signal input circuitry, amplification circuitry,* analog-to-digital conversion circuitry, memory control circuitry, signal output circuitry and control logic circuitry, which includes a microprocessor coupled to switch circuitry, for performing record and playback functional operations with respect to the electrical signals and other regulated components of the record/playback device;

switch means coupled to the control circuitry for selecting the desired functional operations to be performed;

a receiving socket electrically coupled to the memory control circuitry and configured for electrical coupling with a flash memory module which operates as sole memory of the received processed sound electrical signals and is capable of retaining recorded digital information for storage in nonvolatile form;

a speaker coupled to the control circuitry for playback of recorded digital information; and a power source coupled to the control circuitry for supplying electrical power to the device;

wherein the power source is coupled to the switch circuitry; and wherein the switch circuitry includes multiple transistors configured, to enable supply of electrical power to the receiving socket and to enable at least one of the microphone element and the speaker during record and playback functional operations and in response to contol signals provided by the microprocessor, and to optionally disable supply of electrical power to the receiving socket and to optionally enable supply of electrical power to at least one of the microphone element and the speaker between occurrences of record and playback functional operations and in response to control signals provided by the microprocessor.

34. A record/playback device for use with a removable, interchangeable, flash memory recording medium which enables extended recording comparable with tape cassette dictating equipment, said device comprising:

a housing;

a microphone element coupled to the housing and configured to receive and process sound into electrical signals;

control circuitry coupled to the microphone element and including signal input circuitry, amplification circuitry, analog-to-digital conversion circuitry, memory control circuitry, signal output circuitry and control logic circuitry, which includes a microprocessor coupled to switch circuitry, for performing record and playback functional operations with respect to the electrical signals and other regulated components of the record/playback device;

switch means coupled to the control circuitry for selecting the desired functional operations to be performed;

a receiving socket electrically coupled to the memory control circuitry and configured for electrical coupling with a recording medium which is capable of retaining recorded digital information for storage;

a flash memory module which operates as sole memory of the received processed sound electrical signals and is capable of retaining recorded digital information for storage in nonvolatile form;

a speaker coupled to the control circuitry for playback of recorded digital information; and a power source coupled to the control circuitry for supplying electrical power to the device;

wherein the power source is coupled to the switch circuitry; and wherein the switch circuitry includes multiple transistors configured, to enable supply of electrical power to the flash memory module and to enable at least one of the microphone element and the speaker during record and playback functional operations and in response to control signals provided by the microprocessor, and to optionally disable supply of electrical power to the flash memory module and to optionally enable supply of electrical power to at least one of the microphone element and the speaker between occurrences of record and playback functional operations and in response to control signals provided by the microprocessor.

\* \* \* \* \*